United States Patent
Tago

(10) Patent No.: US 7,635,971 B2
(45) Date of Patent: Dec. 22, 2009

(54) DC-DC CONVERTER AND POWER SUPPLY DEVICE CAPABLE OF SYNCHRONIZING FREQUENCIES OF A PLURALITY OF DC-DC CONVERTERS

(75) Inventor: Masanari Tago, Nomi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 303 days.

(21) Appl. No.: 11/620,228

(22) Filed: Jan. 5, 2007

(65) Prior Publication Data

US 2007/0103138 A1  May 10, 2007

Related U.S. Application Data

(63) Continuation of application No. PCT/JP2006/309376, filed on Oct. 5, 2006.

(30) Foreign Application Priority Data

May 11, 2005  (JP)  ............... 2005-138214

(51) Int. Cl.
*G05F 3/08* (2006.01)
(52) U.S. Cl. ...................... 323/350; 323/351
(58) Field of Classification Search ................ 323/272, 323/288, 350, 351; 363/72
See application file for complete search history.

(56) References Cited

U.S. PATENT DOCUMENTS

| | | | |
|---|---|---|---|
| 4,772,995 A * | 9/1988 | Gautherin et al. | 363/21.1 |
| 5,072,171 A * | 12/1991 | Eng | 323/283 |
| 7,453,250 B2 * | 11/2008 | Qiu et al. | 323/288 |
| 2007/0013356 A1 * | 1/2007 | Qiu et al. | 323/288 |
| 2007/0103138 A1 * | 5/2007 | Tago | 323/288 |
| 2007/0114986 A1 * | 5/2007 | Yoshii | 323/288 |

FOREIGN PATENT DOCUMENTS

| | | |
|---|---|---|
| JP | 4-208069 | 7/1992 |
| JP | 4-355660 | 12/1992 |
| JP | 2004-357465 | 12/2004 |
| WO | WO 2004/059826 | * 7/2004 |

OTHER PUBLICATIONS

Chinese Office Action issued Jul. 4, 2008 with Japanese and English Language Translations.
Written Opinion
International Search Report issued Aug. 1, 2006.

* cited by examiner

*Primary Examiner*—Jeffrey L Sterrett
(74) *Attorney, Agent, or Firm*—Keating & Bennett, LLP

(57) ABSTRACT

A switching control IC is provided with a circuit for generating a triangular wave using a frequency that is dependent on a capacitor connected to a CT terminal of the switching control IC, and a resistor connected to an RT terminal thereof. A synchronizing signal input circuit for externally receiving a synchronizing signal that is a pulse voltage signal is connected to the CT terminal. A charging voltage for the capacitor connected to the CT terminal is changed by the synchronizing signal, which synchronizes the frequency of the triangular wave with the synchronizing signal, whereby the frequencies of a plurality of DC-DC converters are synchronized.

12 Claims, 10 Drawing Sheets

(A)

(B)

(C)

(A)

(B)

US 7,635,971 B2

DC-DC CONVERTER AND POWER SUPPLY DEVICE CAPABLE OF SYNCHRONIZING FREQUENCIES OF A PLURALITY OF DC-DC CONVERTERS

CROSS-REFERENCE TO RELATED APPLICATIONS

This is a continuation of PCT/JP2006/309376 filed Oct. 5, 2006, which claims priority of JP2005-138214 filed May 11, 2005, incorporated by reference.

BACKGROUND OF THE INVENTION

1. Technical Field

The present invention relates to a DC-DC converter and a power supply device provided with the DC-DC converter.

2. Related Art

Electronic apparatuses such as a car navigation system into which many functions are integrated include a plurality of circuits such as a DVD circuit, a television and radio circuit, and an audio circuit. The individual circuits require different power supply voltages ranging from a relatively high voltage to a low voltage (for example, 9V, 8V, 7V, 5V, 3.3V, and 1.2V).

A device provided with a plurality of DC-DC converter circuits, each of which outputs a single voltage, can be considered as a power supply device for such a multifunction electronic apparatus.

In such a power supply device provided with a plurality of DC-DC converters, if the switching frequencies of the individual DC-DC converters are different from each other, it is difficult to perform noise control. Accordingly, the switching frequencies of individual DC-DC converters are synchronized (see, for example, Japanese Utility Model Registration No. 2583479).

In a power supply device disclosed in Japanese Utility Model Registration No. 2583479, a resistor and a capacitor which are used to determine an oscillation frequency are externally connected to a switching control IC. In order to synchronize the oscillation frequencies of two switching control ICs, a circuit connected between the capacitor connection terminals (CT terminals) of the switching control ICs is prepared. That is, the capacitor connection terminals of the two switching control ICs are connected to each other via a balancing capacitor. The oscillation frequencies of the two switching control ICs are synchronized by causing the balancing capacitor to perform a synchronization function.

In addition, some switching control ICs, each of which requires such a resistor and capacitor to be externally connected thereto, have a function allowing switching control ICs of the same type to be synchronized. Usually, the oscillation circuit of a master switching control IC is operated, and then, the operation of the oscillation circuit of a slave switching control IC is stopped. Subsequently, the slave IC performs a switching operation in synchronization with a signal output from the master IC.

In a power supply device for which voltage outputs ranging from a relatively high voltage to a low voltage are required, if the output voltage of a DC-DC converter is high, that is, if a difference between an input voltage and an output voltage is small, an on duty ratio (duty cycle) increases at the time of switching, and a period in which a current passes through a flywheel diode (the off period of a switching element) becomes short. Consequently, a loss due to a forward voltage drop in the flywheel diode becomes small. In contrast, if the output voltage of a DC-DC converter is low, the period in which a current passes through the flywheel diode becomes long. Consequently, the loss due to a voltage drop becomes an issue.

Accordingly, in a DC-DC converter having a low output voltage, a synchronous rectifier circuit using a switching element (FET) of a low on-resistance is sometimes used instead of a flywheel diode. However, a control IC suitable for the synchronous rectifier circuit, which has to control both a main switching element and a switching element for synchronous rectification, contains a VCO (voltage-controlled oscillator), and is configured to control a switching frequency by applying a control voltage to the VCO. That is, the control IC is not configured to determine an oscillation frequency using a resistor and a capacitor which are externally connected thereto.

Thus, in an arrangement including both a DC-DC converter using a switching control IC that contains a VCO, and a DC-DC converter using a switching control IC to which a resistor and a capacitor are externally connected, a known method disclosed in Japanese Utility Model Registration No. 2583479 cannot be employed.

SUMMARY OF THE INVENTION

The present invention addresses these issues and provides a DC-DC converter and a power supply device capable of synchronizing the frequencies of a plurality of DC-DC converters by overcoming the above-described difficulties.

DC-DC converter according to an embodiment of the present invention may have the following configuration.

(1) The DC-DC converter may include: a triangular wave generation circuit for charging and discharging a capacitor and for generating a triangular wave by switching between charging and discharging in accordance with a charging voltage; and a PWM control circuit for controlling an output of the DC-DC converter by controlling an on duty ratio of a switching element on the basis of the triangular wave. In the DC-DC converter, by applying a voltage of a synchronizing signal that is a pulse voltage signal to the capacitor to control an electric charge of the capacitor, the triangular wave can be synchronized with the pulse voltage signal.

(2) The electric charge of the capacitor may be controlled in such a manner that the capacitor is rapidly charged until the electric charge of the capacitor reaches a switching level at which charging is switched to discharging.

(3) The triangular wave generation circuit may determine charging and discharging current values for the capacitor from an impedance of a resistance circuit.

(4) The DC-DC converter may further include a switch for changing the impedance of the resistance circuit using a frequency switching signal.

(5) A shunt switch that is turned on or off in accordance with a control signal may be disposed at a synchronizing signal input unit of the capacitor into which the synchronizing signal is input.

(6) The DC-DC converter may be used as a slave DC-DC converter. A single master DC-DC converter can provide a synchronizing signal for the one or more slave DC-DC converters.

(7) The master DC-DC converter may contain an oscillator and outputs an oscillating signal output from the oscillator or a signal synchronized with the oscillating signal as the synchronizing signal.

(8) The master DC-DC converter may externally receive an external oscillating signal and output a signal synchronized with the external oscillating signal as the synchronizing signal.

(9) A plurality of DC-DC converters may be combined according to another embodiment of the present invention. A common synchronizing signal can be externally input into each of the DC-DC converters.

Advantages of the various embodiments of the invention include the following:

(1) The voltage change of a capacitor which is dependent on the charging and discharging of the capacitor is output to a circuit as a triangular wave. The electric charge of the capacitor is controlled by applying the voltage of a pulse voltage signal to the capacitor. Consequently, the triangular wave is synchronized with the pulse voltage signal, whereby a switching operation can be performed on a plurality of DC-DC converters using the same switching frequency.

(2) The capacitor is rapidly charged in accordance with a synchronizing signal until the electric charge of the capacitor reaches a switching level at which charging is switched to discharging, whereby the frequencies of the triangular wave and the synchronizing signal can be easily synchronized with certainty.

(3) A triangular wave generation circuit is configured to determine charging and discharging current values for the capacitor from an impedance of a resistance circuit, whereby a variable frequency triangular wave generation circuit can be easily obtained.

(4) A switch is provided for changing the impedance of the resistance circuit, which is used to determine the charging and discharging current values for the capacitor by the triangular wave generation circuit, using a frequency switching signal, whereby a frequency range in which frequency synchronization can be performed can be extended.

(5) When a shunt switch disposed at a synchronizing signal input unit of the capacitor, into which the synchronizing signal is input, is turned on, the triangular wave generation circuit does not receive the effect of the pulse voltage signal, and can therefore perform a self-oscillation operation and prevent a capacitor connection terminal thereof from the application of an overvoltage.

(6) The above-described DC-DC converters, the frequencies of which can be synchronized, are used as slave DC-DC converters. A single master DC-DC converter provides a synchronizing signal for the slave DC-DC converters, whereby the switching frequencies of a plurality of DC-DC converters can be synchronized.

(7) A DC-DC converter having a low output voltage and including a synchronous rectifier circuit is used as the master DC-DC converter, and an oscillator is provided for the master DC-DC converter. DC-DC converters in which a triangular wave is generated by charging or discharging a capacitor are used as the slave DC-DC converters. Consequently, a power supply device capable of providing many outputs over a wide voltage range from a relatively high voltage to a low voltage can be obtained.

(8) The master DC-DC converter externally receives an external oscillating signal, and outputs a signal synchronized with the external oscillating signal as the synchronizing signal, whereby the switching frequencies of a plurality of DC-DC converters can be synchronized.

(9) A plurality of DC-DC converters are combined according to another embodiment of the present invention. A common synchronizing signal is externally input into each of the DC-DC converters, whereby the switching frequencies of a plurality of DC-DC converters can be synchronized.

Other features and advantages of the present invention will become apparent from the following description of embodiments of invention which refers to the accompanying drawings.

DETAILED DESCRIPTION OF EMBODIMENTS OF THE INVENTION

Figure 1:
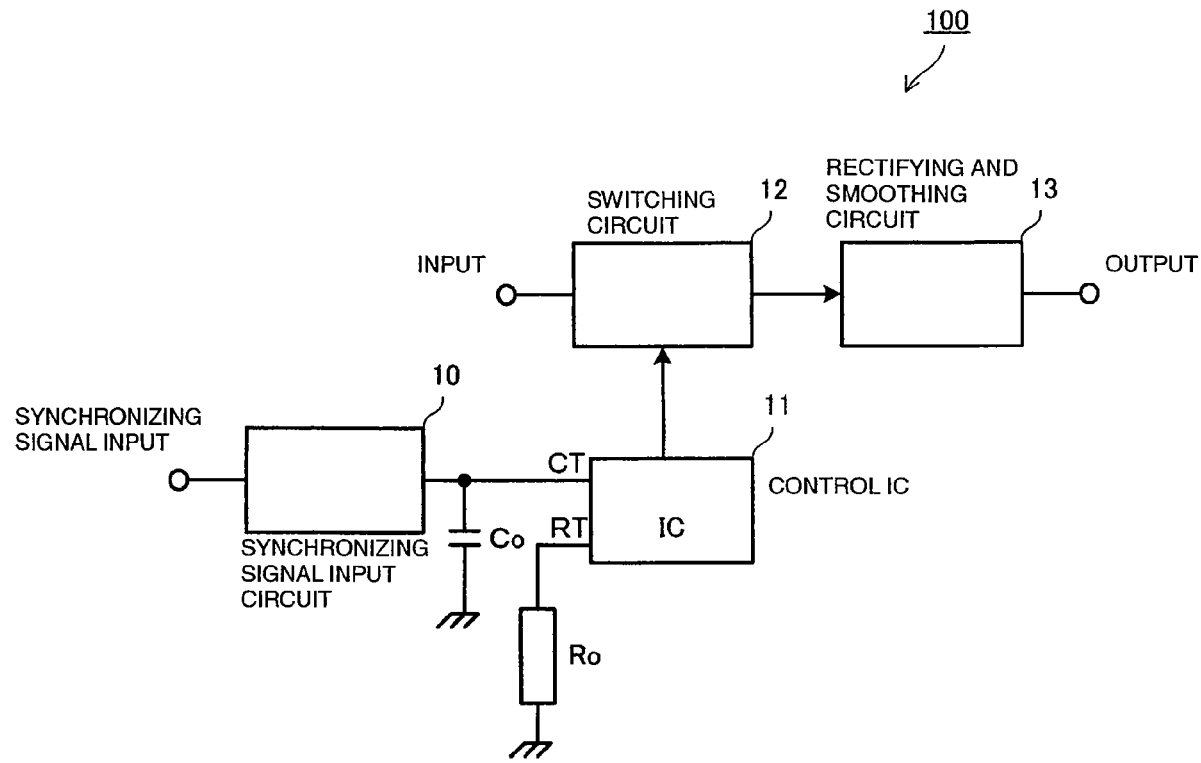
FIG. 1 is a block diagram showing a configuration of a DC-DC converter according to a first embodiment of the present invention.

A DC-DC converter according to a first embodiment of the present invention will be described with reference to FIGS. 1 through 8. FIG. 1 is a block diagram showing a configuration of a DC-DC converter. A DC-DC converter 100 is provided with a switching circuit 12 for performing a switching operation of input power, a rectifying and smoothing circuit 13 for rectifying and smoothing an output from the switching circuit 12, a switching control IC (hereafter referred to as a control IC) 11 for driving a switching element included in the switching circuit 12, and a synchronizing signal input circuit 10 for inputting a synchronizing signal into the control IC 11. A capacitor Co is connected to a CT terminal of the control IC 11, and a resistor Ro is connected to an RT terminal of the control IC 11. The synchronizing signal input circuit 10 inputs a synchronizing signal that is a pulse voltage signal into the control IC 11 and directly controls the voltage of the capacitor Co connected to the CT terminal of the control IC 11 so as to synchronize the frequency of a triangular wave that occurs within the control IC 11 with the synchronizing signal. The control IC 11 is provided with a PWM control circuit for controlling the output of the DC-DC converter 100 by controlling the on duty ratio of the switching element using the triangular wave, and performs PWM control upon the switching element in accordance with a load so that a constant voltage can be output.

Figure 2:
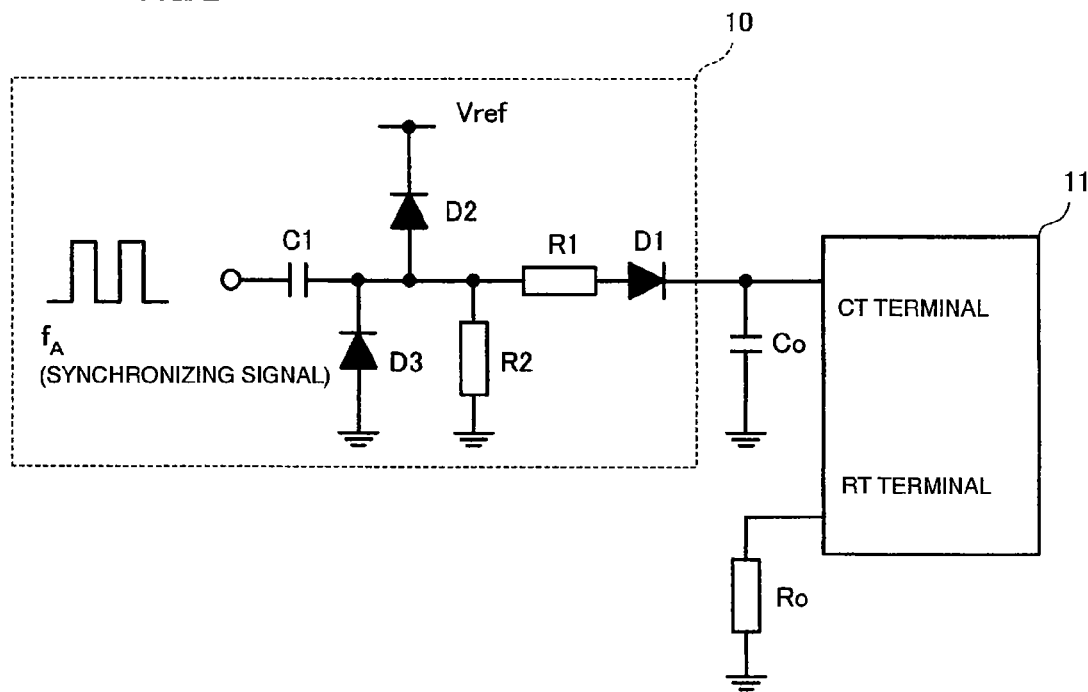
FIG. 2 is a circuit diagram showing a configuration of a synchronizing signal input circuit of the DC-DC converter.

FIG. 2 is a circuit diagram showing a configuration of the synchronizing signal input circuit 10 shown in FIG. 1. In FIG. 2, a CR differentiation circuit is formed by a capacitor C1 and a resistor R2. The output voltage of this differentiation circuit is applied to the CT terminal of the control IC 11 via a resistor R1 and a diode D1. The diode D1 is connected to the capacitor Co connected to the CT terminal of the control IC 11 in a direction of a charging current flow. Accordingly, the discharging current of the capacitor Co cannot flow into the synchronizing signal input circuit 10.

A diode D2 used for clamping is disposed between a reference voltage power supply Vref and a node at which the capacitor C1 and the resistor R2, which form the differentiation circuit, are connected, and a diode D3 used for clamping is disposed between the node and the ground. Accordingly, a voltage higher than that of the reference voltage power supply Vref is not applied to the CT terminal of the control IC 11, and, in addition, a voltage lower than the ground potential is not applied to the CT terminal irrespective of the voltage of an externally input synchronizing signal. Furthermore, the amount of voltage change is appropriately controlled using a time constant that is dependent on the capacitor C1 and the resistor R2. These conditions help avoid the breakdown of the control IC 11.

Figure 3:
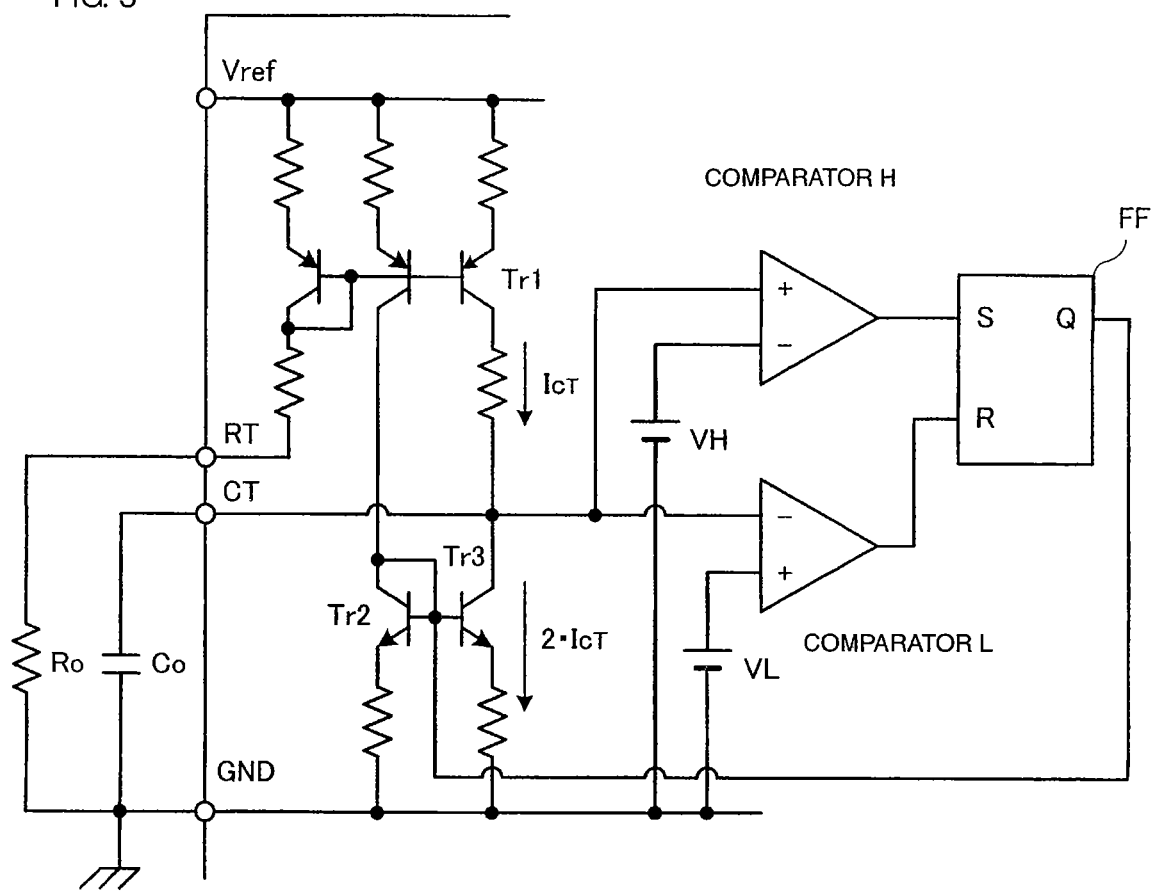
FIG. 3 is a circuit diagram showing a configuration of a triangular wave generating circuit part of a control IC.

FIG. 3 is a circuit diagram showing a triangular wave generating part of the control IC 11 shown in FIGS. 1 and 2. The operation of this circuit is as follows.

(1) A current passing through a transistor Tr1 is defined as a current ICT. This current ICT is dependent on the resistor Ro. A current passing through a transistor Tr3 is set so that the current can become 2×ICT. Since an output Q of a flip-flop FF has a low "L" level at startup, a transistor Tr2 is in an off state at that time and the capacitor Co is charged with the current ICT. Accordingly, a charging time at that time is dependent on the resistor Ro and the capacitor Co.

(2) When the voltage of the capacitor Co reaches a high voltage threshold value VH, the output of a comparator H is inverted, the flip-flop FF is set, and the transistor Tr2 is turned on in accordance with the output Q. A charging current is set in this state so that the current can become 2×ICT. Accordingly, a current passing through the capacitor Co becomes ICT−2×ICT=−ICT, and the capacitor Co is therefore discharged with the current ICT. Accordingly, a discharging time at that time is dependent on the resistor Ro and the capacitor Co.

(3) When the voltage of the CT terminal reaches a low voltage threshold value VL, the output of a comparator L is inverted, the flip-flop FF is reset, and the transistor Tr2 is turned off in accordance with the output Q. Accordingly, the capacitor Co is charged again.

(4) A symmetrical triangular wave having an amplitude between VL and VH is generated by repeating the above-described processes (2) and (3).

Figure 4:
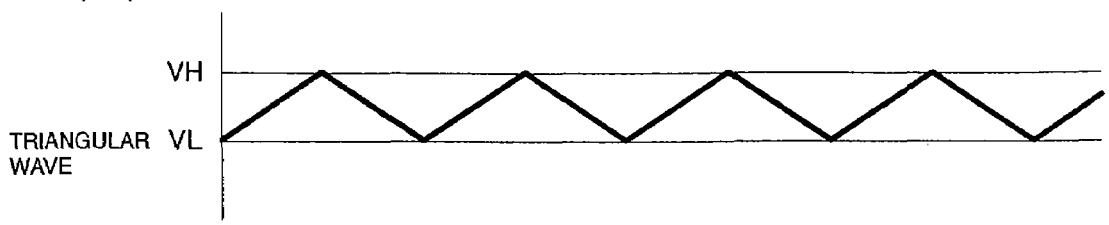
FIG. 4 is a waveform diagram showing a relationship between a synchronizing signal and a triangular wave.
Figure 4:
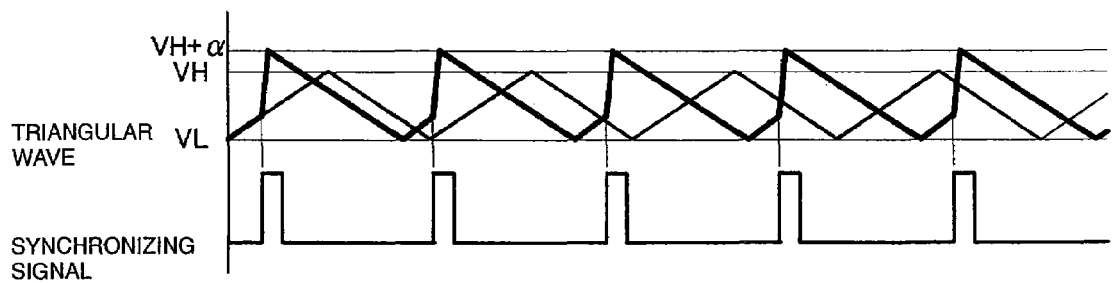
Figure 4:
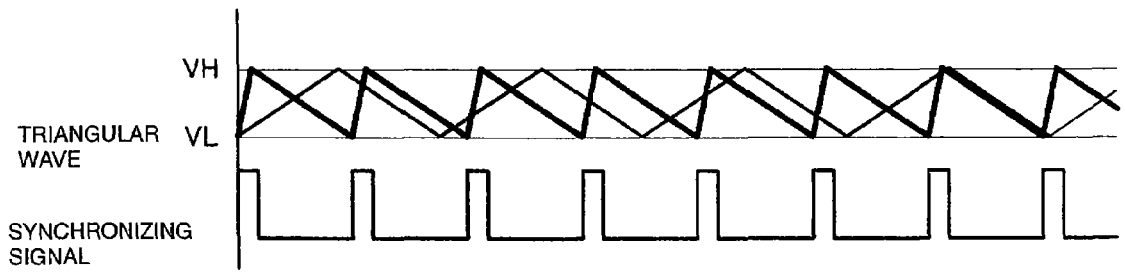

FIG. 4 is a diagram showing waveforms of individual circuits shown in FIG. 2. When a synchronizing signal is not input, a triangular wave that falls within the range of the high voltage threshold value VH to the low voltage threshold value VL is output to the CT terminal as shown in FIG. 4(A).

FIG. 4(B) shows the change of a triangular wave when a synchronizing signal having a frequency (having a shorter cycle) higher than that of the original triangular wave is input. On the rising edge of the synchronizing signal, a charging voltage is applied to the capacitor Co by the differentiation circuit formed by the capacitor C1 and resistor R2 shown in FIG. 2, electric charges are rapidly stored in the capacitor Co, and the electric potential of the CT terminal markedly increases. When the electric potential of the CT terminal reaches a potential VH+α higher than the high voltage threshold value VH, the output of the comparator H shown in FIG. 3 is inverted, and then the voltage of the CT terminal decreases. This voltage difference +α is caused by the delayed response of the comparator H. Since the discharging current value of the capacitor Co is constant, the falling gradient of this triangular wave is the same as that of the original triangular wave.

FIG. 4(C) shows an example in which the frequency of a synchronizing signal is set higher. As the frequency of the synchronizing signal increases, electric charges are rapidly stored in the capacitor Co in the earlier stage of the rising phase of the original triangular wave (because the amount of electric charge stored in the capacitor Co in advance is small). Accordingly, the effect of the delayed response of the comparator H shown in FIG. 3 is reduced, and in addition, the electric potential difference +α decreases. Consequently, a triangular wave shown in FIG. 4(C) is output.

Figure 5:
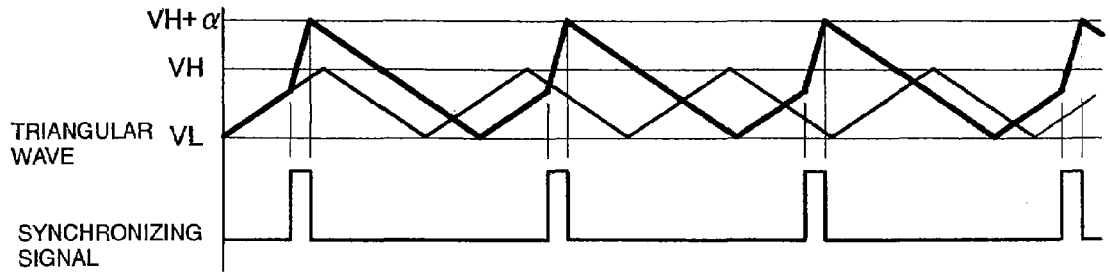
FIG. 5 is a waveform diagram showing a relationship between a synchronizing signal and a triangular wave.

FIG. 5 shows an example in which a synchronizing signal having a frequency (having a longer cycle) lower than that of an original triangular wave is input. As the frequency of a synchronizing signal decreases, the electric potential of the capacitor Co starts to markedly increase at a point nearer to the peak of the rising phase of the original triangular wave (because the amount of electric charge stored in the capacitor Co in advance is large). Accordingly, the electric potential difference +α increases, and the falling phase of a triangular wave therefore becomes longer. Consequently, a triangular wave synchronized with the synchronizing signal shown in FIG. 5 is output.

Figure 6:
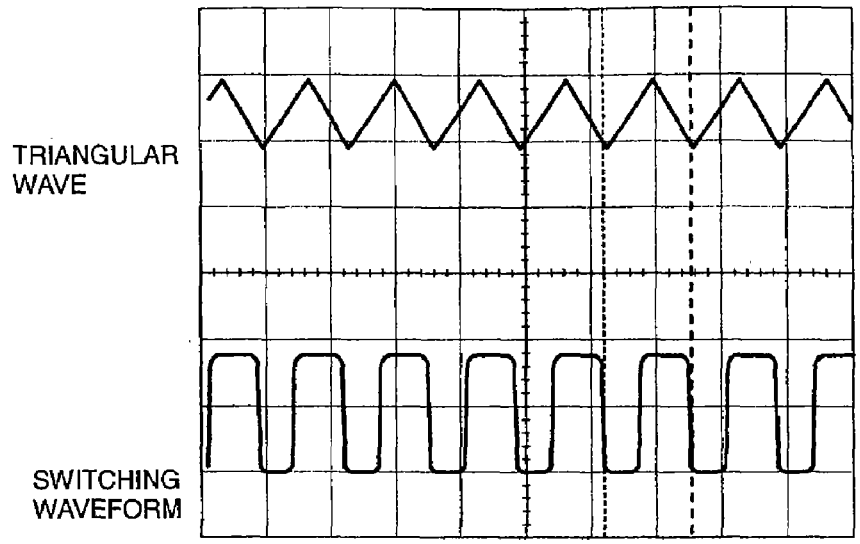
FIG. 6 is a diagram showing a relationship between a triangular wave and a switching waveform.
Figure 7:
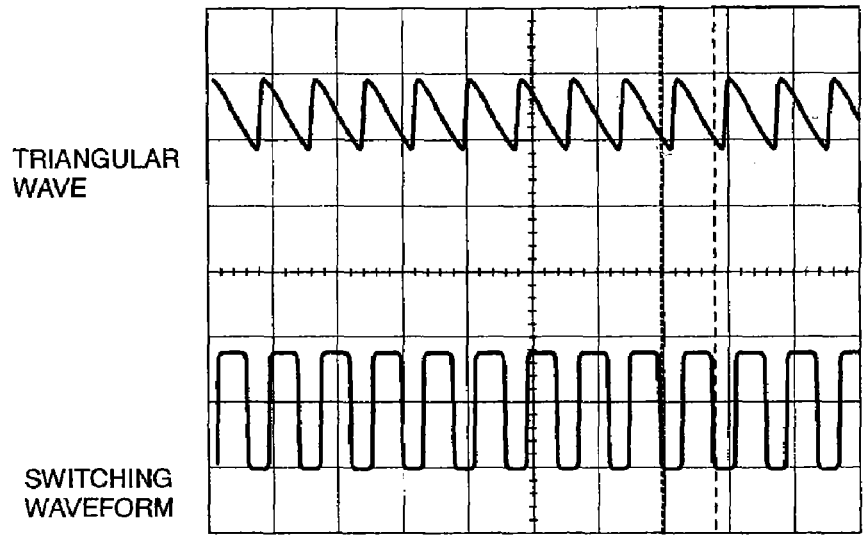
FIG. 7 is a diagram showing a relationship between a triangular wave and a switching waveform.
Figure 8:
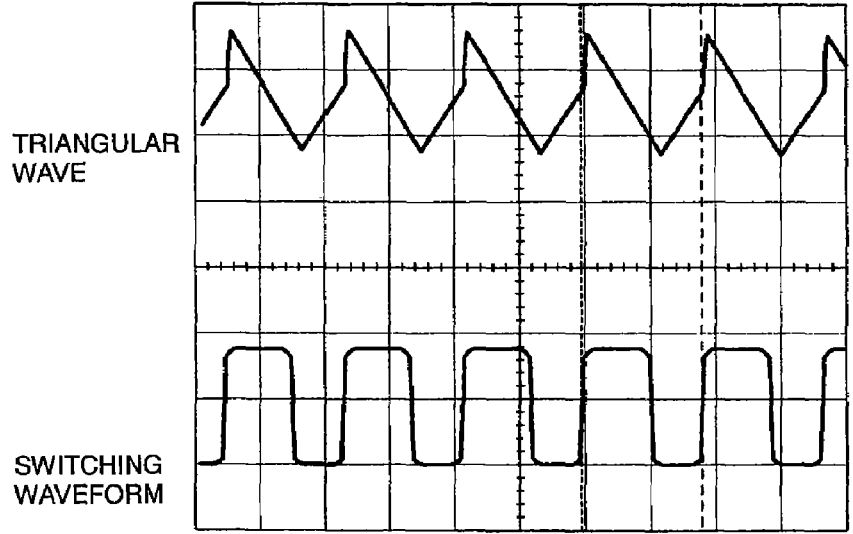
FIG. 8 is a diagram showing a relationship between a triangular wave and a switching waveform.

FIGS. 6 through 8 are diagrams showing a relationship between a triangular wave and a switching waveform. FIG. 6 shows a triangular wave and a switching waveform which are acquired when a synchronizing signal is not input. The frequency of the switching waveform becomes the same (f=375 kHz) as that of the triangular wave.

FIG. 7 shows a case in which the triangular wave shown in FIG. 4(C) is generated. In this case, the frequency of the synchronizing signal is 625 kHz, and the frequencies of both the triangular wave and a switching waveform also become 625 kHz.

FIG. 8 shows a case in which the triangular wave shown in FIG. 5 is generated. In this case, the frequency of the synchronizing signal is 274 kHz, and the frequencies of both the triangular wave and a switching waveform also become 274 kHz.

Thus, a switching frequency can be synchronized with a synchronizing signal by controlling the electric charge of the capacitor Co.

Although a switching frequency is synchronized with a synchronizing signal, the duty ratio of a switching waveform is changed by PWM control performed in accordance with the load of a DC-DC converter.

Figure 9:
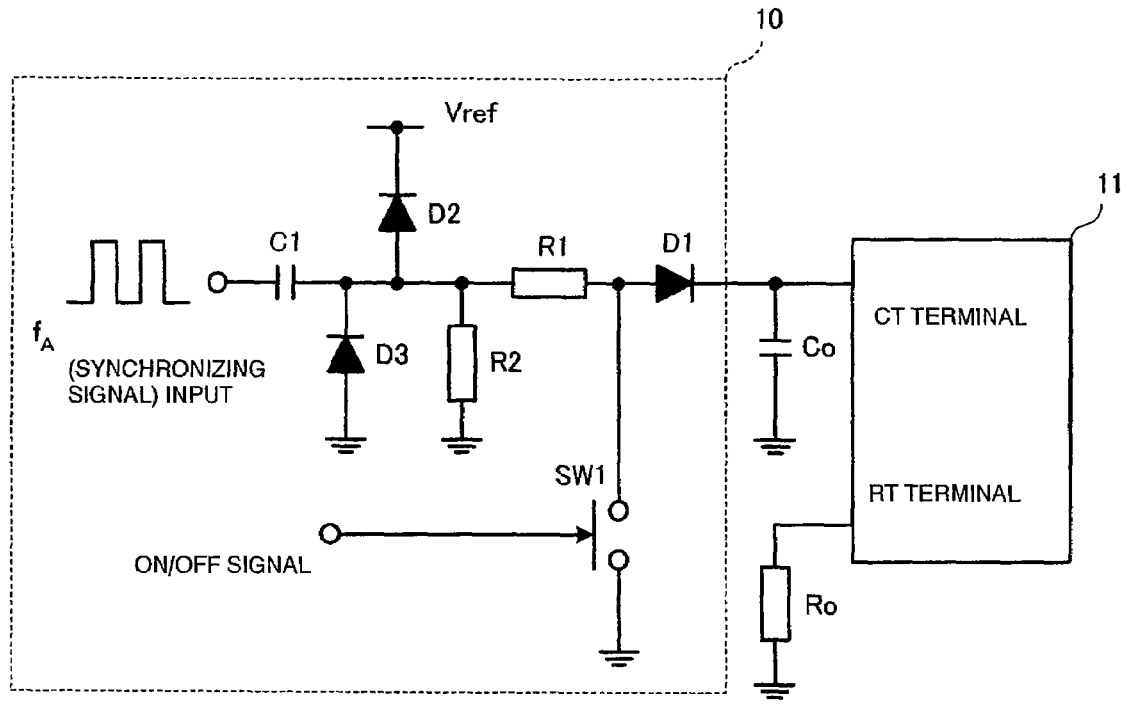
FIG. 9 is a circuit diagram showing a configuration of a synchronizing signal input circuit of a DC-DC converter according to a second embodiment of the present invention.

Next, a DC-DC converter according to a second embodiment of the present invention will be described with reference to FIG. 9. FIG. 9 is a diagram corresponding to FIG. 2 that is used to describe the first embodiment, and shows a configuration of the synchronizing signal input circuit 10. The configuration shown in FIG. 9 is different from that shown in FIG. 2. A shunt switch SW1 is disposed between the anode of the diode D1 and the ground. The switch SW1 is controlled by an on/off signal, and may comprise, for example, a bipolar transistor or an FET.

When the switch SW1 is brought into conduction by the on/off signal, even if a synchronizing signal is input, the synchronizing signal is shunted at the anode of the diode D1. A charging voltage is not therefore applied to the capacitor Co. Accordingly, switching between synchronization and asynchronization can be achieved by controlling the switch SW1. For example, in a power supply device provided with a plurality of DC-DC converters, if a circuit shown in FIG. 9 is applied to each of the DC-DC converters, switching control can be performed without receiving the effect of the input of a synchronizing signal by performing a self-oscillation operation in each DC-DC converter until a master DC-DC converter is activated. After the master DC-DC converter has been activated, the switch SW1 is turned off. After that, switching control can be performed in synchronization with the master DC-DC converter.

When the switch SW1 is brought into conduction in a state in which the control IC 11 is turned off (there is no power supply), even if a synchronizing signal is input, the control IC 11 does not receive the effect of the input of the synchronizing signal. This helps avoid a malfunction of the control IC 11.

Next, a DC-DC converter according to a third embodiment of the present invention will be described with reference to FIGS. 10 through 12.

Figure 10:
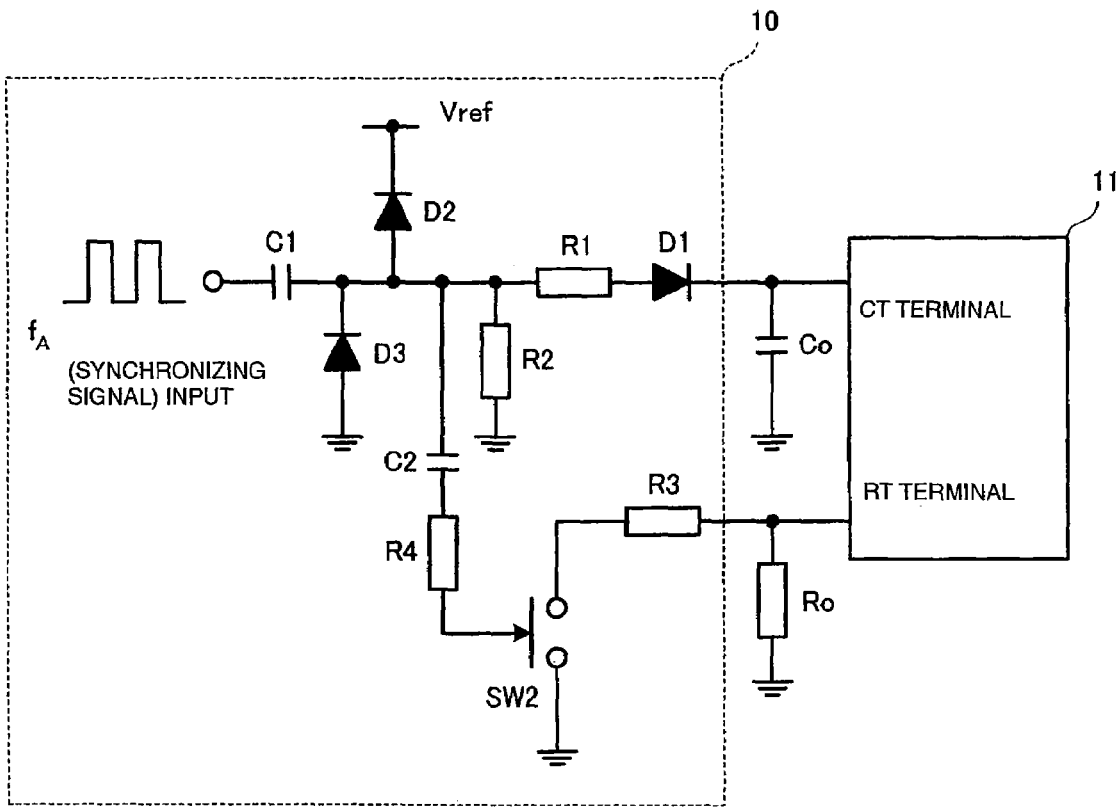
FIG. 10 is a circuit diagram showing a configuration of a synchronizing signal input circuit of a DC-DC converter according to a third embodiment of the present invention.

FIG. 10 is a diagram showing a configuration of a synchronizing signal input circuit. The configuration shown in FIG. 10 is different from that shown in FIG. 2. A switch circuit SW2 is disposed at the RT terminal of the control IC 11 via a resistor R3. The switch circuit SW2 is configured to be controlled by a signal transmitted from a node between the capacitor C1 and the resistor R2 via a capacitor C2 and a resistor R4.

Figure 11:
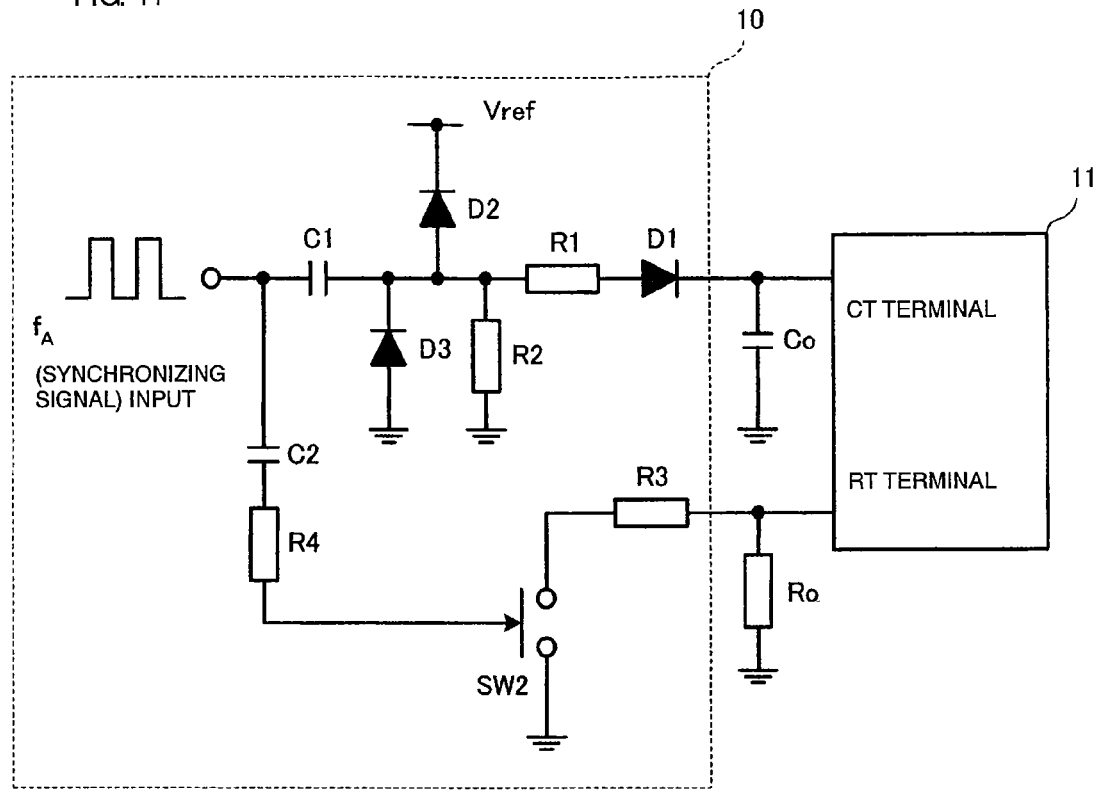
FIG. 11 is a circuit diagram showing a configuration of a synchronizing signal input circuit of another DC-DC converter according to the third embodiment of the present invention.
Figure 12:
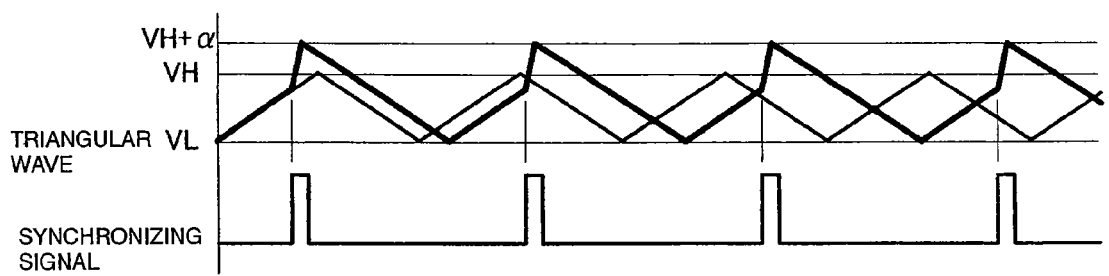
FIG. 12 is a diagram showing a relationship between a triangular wave and a synchronizing signal.
Figure 12:
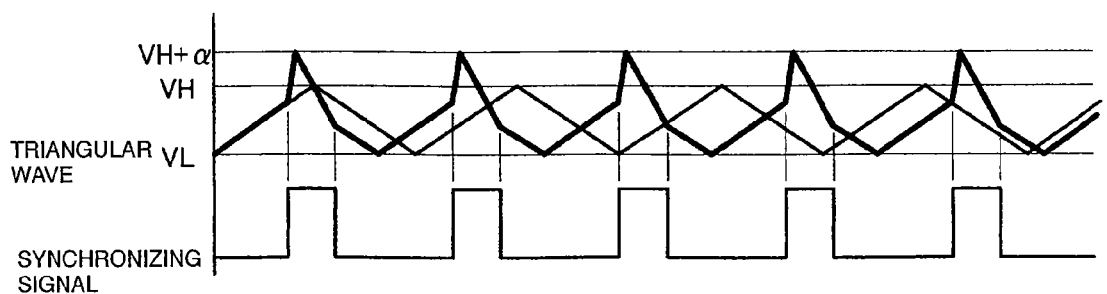

In an example shown in FIG. 11, the switch circuit SW2 is configured to be controlled by a signal transmitted from a synchronizing signal input terminal via the capacitor C2 and the resistor R4.

In the configurations shown in FIGS. 10 and 11, if the switch circuit SW2 is brought into conduction, a parallel circuit formed by the resistor Ro and the resistor R3 is connected to the RT terminal of the control IC 11. At that time, the value of a current charged into or discharged from the capacitor Co increases. If the switch SW2 is configured to be brought into conduction when the control voltage of the switch SW2 is a high "H" level, and to be brought out of conduction when the control voltage thereof is an "L" level, the value of a current charged into or discharged from the capacitor Co increases after the rising edge of a synchronizing signal. Accordingly, after the potential of the CT terminal of the control IC 11 reaches the potential VH+α, the potential of the CT terminal rapidly decreases. Consequently, a large change in frequency can be acquired in a frequency increasing direction as shown in FIG. 12(B).

If the pulse width of a synchronizing signal is set short as shown in FIG. 12(A), the effect of the synchronizing signal is not applied to the discharging of the capacitor Co. Accordingly, the frequency of a triangular wave can be synchronized with the synchronizing signal also in a frequency decreasing direction (like the cases of the first and second embodiments) as shown in FIG. 12(A).

Figure 13:
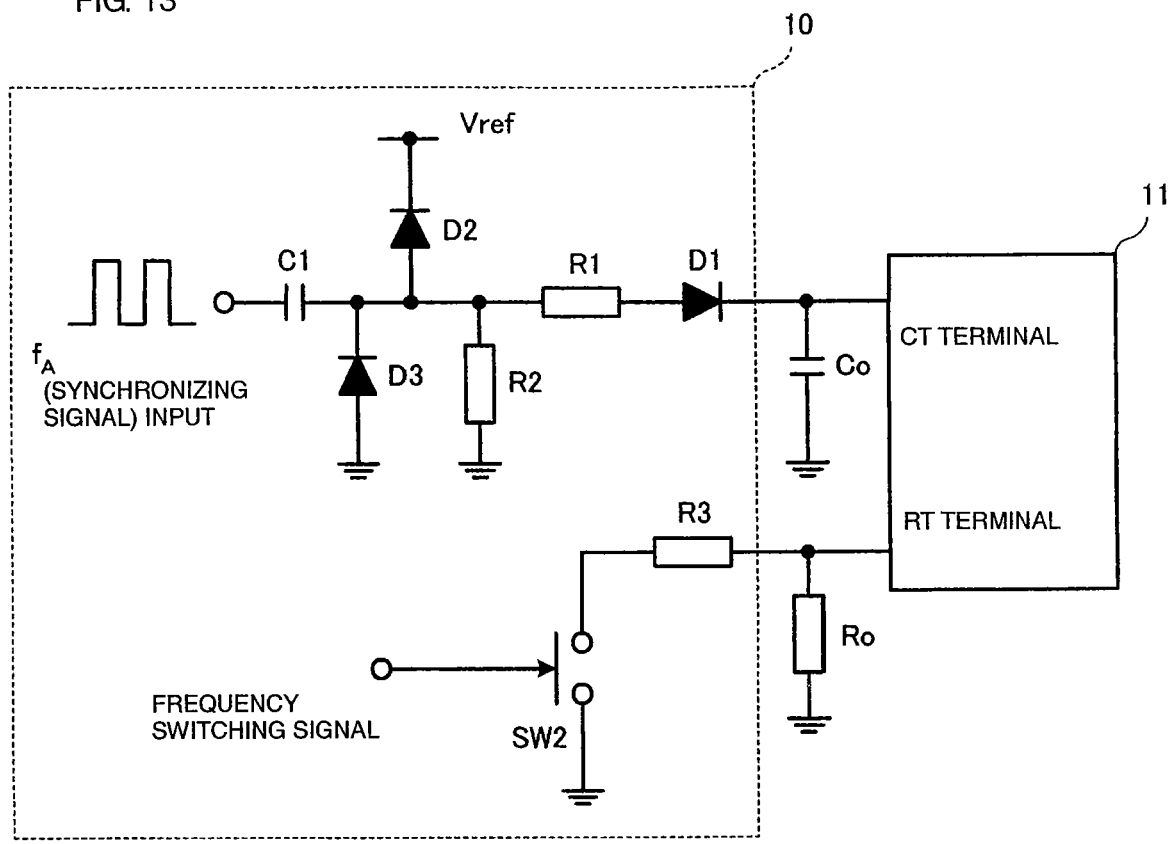
FIG. 13 is a circuit diagram showing a configuration of a synchronizing signal input circuit of a DC-DC converter according to a fourth embodiment of the present invention.

Next, a DC-DC converter according to a fourth embodiment of the present invention will be described with reference to FIG. 13. FIG. 13 is a diagram showing a configuration of a synchronizing signal input circuit. This configuration is different from that shown in FIG. 11. The switch circuit SW2 is disposed at the RT terminal of the control IC 11 via the resistor R3. The switch circuit SW2 is configured to be controlled by a frequency switching signal.

Thus, the charging or discharging current value of the capacitor Co can be changed by controlling the switching circuit SW2 using a frequency switching signal. Since the impedance of a resistance circuit connected to the RT terminal of the control IC 11 is reduced in a state in which the switching circuit SW2 is conducting, the charging or discharging current value of the capacitor Co increases. Accordingly, a large change in frequency can be acquired in a frequency increasing direction. In contrast, if the switching circuit SW2 is brought out of conduction, a large change in frequency can be acquired in a frequency decreasing direction.

In the above-described embodiments, synchronization is achieved by controlling the charging of the capacitor Co. However, in contrast, synchronization may be achieved by controlling the discharging of the capacitor Co.

Figure 14:
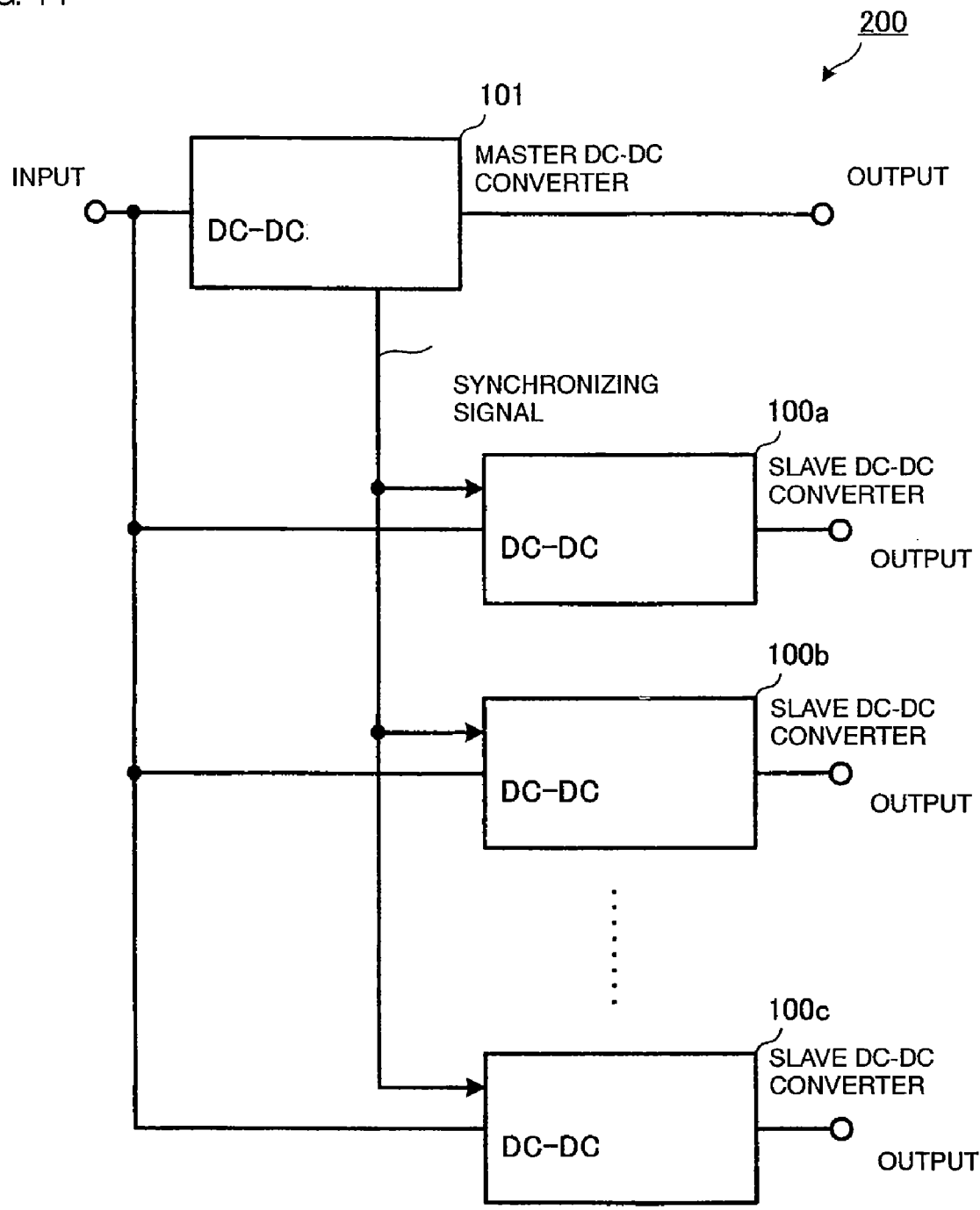
FIG. 14 is a block diagram showing a configuration of a power supply device according to a fifth embodiment of the present invention.

Next, a power supply device according to a fifth embodiment of the present invention will be described with reference to FIG. 14. As shown in FIG. 14, a power supply device 200 is provided with a single master DC-DC converter 101 and a plurality of slave DC-DC converters 100a, 100b, and 100c. DC power is input into each of the above-described DC-DC converters, and a predetermined constant DC voltage is output from each of the above-described DC-DC converters.

The output voltage of the master DC-DC converter 101 is relatively low. In a configuration using a flywheel diode, a loss due to a forward voltage drop that would occur in the flywheel diode during the off period of a switching element would be large. Accordingly, in the configuration of the master DC-DC converter 101, a synchronous rectifier circuit using an FET is formed. A control IC for the synchronous rectifier circuit contains a VCO. A switching frequency can be controlled by applying a control voltage to the VCO. A synchronizing signal output from this control IC is provided for the slave DC-DC converters 100a, 100b, and 100c as shown in FIG. 14.

The configurations of the slave DC-DC converters 100a, 100b, and 100c have been described in the first to fourth embodiments. The output voltage of each of the slave DC-DC converters 100a, 100b, and 100c is higher than that of the master DC-DC converter 101. Accordingly, they use a flywheel diode instead of a synchronous rectifier circuit, and are provided with a control IC to which a resistor and a capacitor are externally connected. The frequency of a triangular wave is dependent on the resistor and the capacitor.

Thus, a power supply device capable of providing many outputs over a wide voltage range from a low voltage to a high voltage is obtained.

Figure 15:
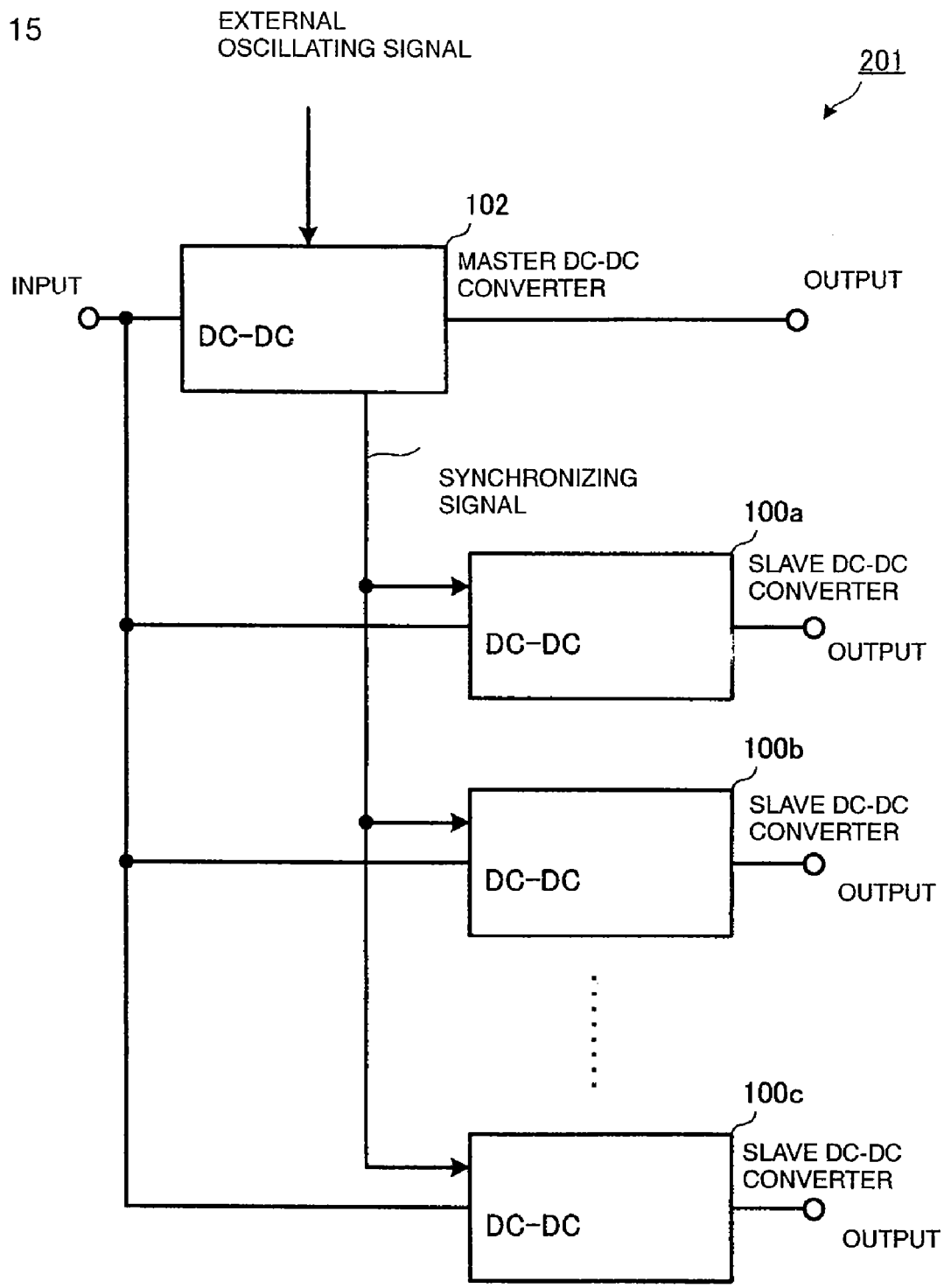
FIG. 15 is a block diagram showing a configuration of a power supply device according to a sixth embodiment of the present invention.

Next, a power supply device according to a sixth embodiment of the present invention will be described with reference to FIG. 15. As shown in FIG. 15, a power supply device 201 is provided with a single master DC-DC converter 102 and the slave DC-DC converters 100a, 100b, and 100c. DC power is input into each of the above-described DC-DC converters, and a predetermined constant DC voltage is output from each of the above-described DC-DC converters.

The master DC-DC converter 102 externally receives an external oscillating signal, and performs a switching operation upon a switching element using the external oscillating signal. In addition, the master DC-DC converter 102 outputs a signal synchronized with the switching operation to the slave DC-DC converters 100a, 100b, and 100c as a synchronizing signal as shown in FIG. 15. The configurations of the slave DC-DC converters 100a, 100b, and 100c have been described in the first to fourth embodiments. Thus, a power supply device capable of providing many outputs of a predetermined voltage is obtained.

Figure 16:
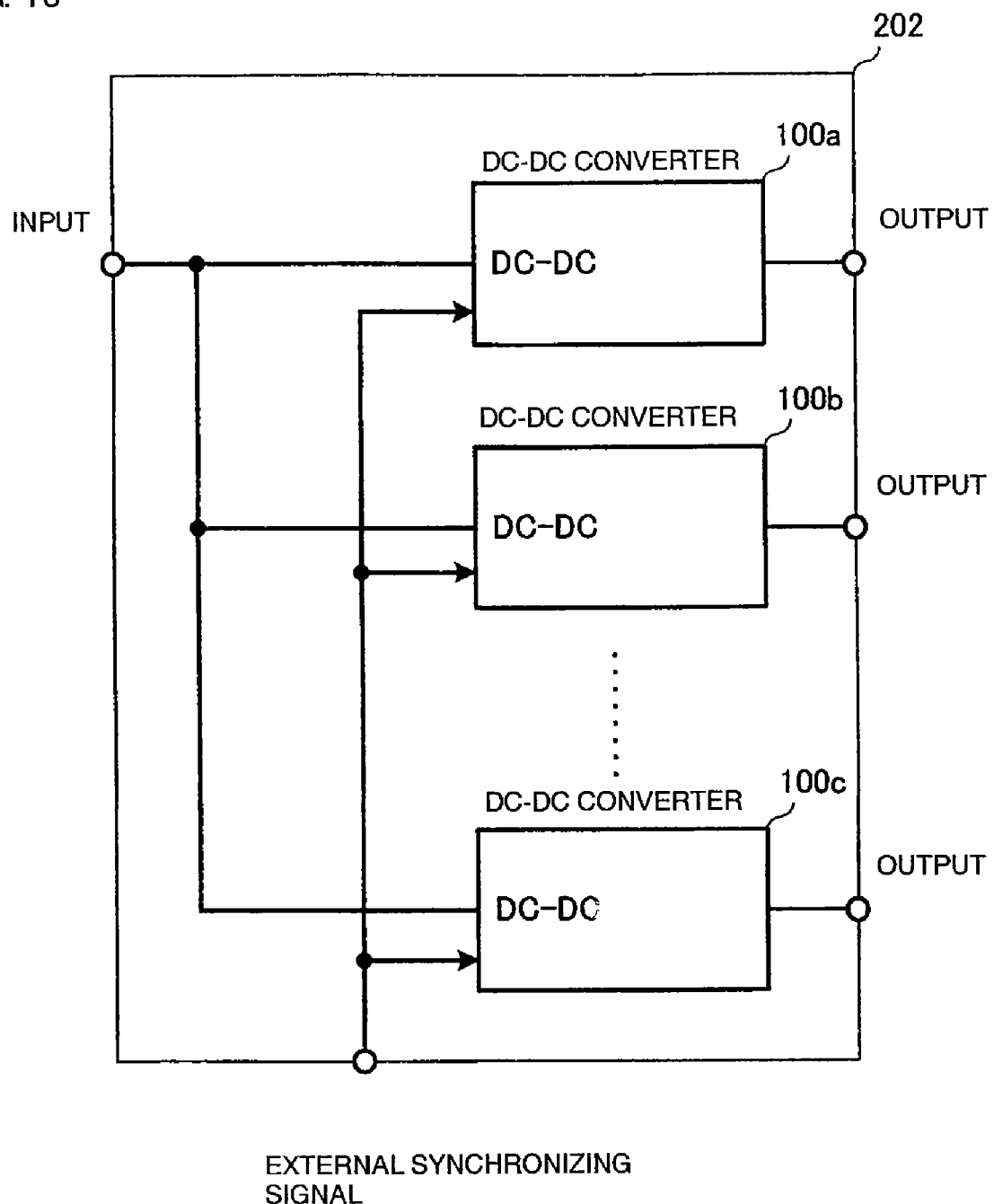
FIG. 16 is a block diagram showing a configuration of a power supply device according to a seventh embodiment of the present invention.

Next, a power supply device according to a seventh embodiment of the present invention will be described with reference to FIG. 16. As shown in FIG. 16, a power supply device 202 is provided with the DC-DC converters 100a, 100b, and 100c as a single unit. There is no master/slave relationship between the DC-DC converters. DC power is input into each of the above-described DC-DC converters, and a predetermined constant DC voltage is output from each of the above-described DC-DC converters.

A common synchronizing signal is externally input into the DC-DC converters 100a, 100b, and 100c. The configurations of the slave DC-DC converters 100a, 100b, and 100c have been described in the first to fourth embodiments. Thus, a power supply device capable of providing many outputs of a predetermined voltage is obtained.

Although the present invention has been described in relation to particular embodiments thereof, many other variations and modifications and other uses will become apparent to those skilled in the art. Therefore, the present invention is not limited by the specific disclosure herein.

What is claimed is:

1. A DC-DC converter comprising:
    a capacitor;
    a resistor;
    a control IC including;
        a triangular wave generation circuit which charges and discharges the capacitor and generates a triangular wave by switching between charging and discharging in accordance with a charging voltage; and
        a PWM control circuit which controls an output of the DC-DC converter by controlling an on duty ratio of a switching element on the basis of the triangular wave; and
        a synchronizing signal input circuit arranged to apply a synchronizing pulse voltage signal to the capacitor to control an electric charge of the capacitor, whereby such that the frequency of the triangular wave is changed so as to be synchronized with the pulse voltage signal; wherein
    the capacitor and the resistor are arranged outside the control IC and are connected to terminals of the control IC, the capacitor having a predetermined capacitance and the resistor having a predetermined resistance which define a frequency of the triangular wave.

2. The DC-DC converter according to claim 1, wherein the electric charge of the capacitor is controlled in such a manner that the capacitor is rapidly charged until the electric charge of the capacitor reaches a switching level at which charging is switched to discharging.

3. The DC-DC converter according to claim 2, wherein the triangular wave generation circuit determines charging and discharging current values for the capacitor from an impedance of a resistance circuit.

4. The DC-DC converter according to claim 3, further comprising a switch for changing the impedance of the resistance circuit using a frequency switching signal.

5. The DC-DC converter according to claim 1, further comprising a shunt switch that can be turned on or off in accordance with a control signal, said shunt switch being disposed at a synchronizing signal input unit of the capacitor into which the synchronizing signal is input.

6. A power supply device comprising:
    a slave DC-DC converter according to any one of claims 1 to 5;
    a master DC-DC converter; and
    means for causing the master DC-DC converter to provide a synchronizing signal for the slave DC-DC converter.

7. The power supply device according to claim 6, wherein the master DC-DC converter contains an oscillator, and includes means for outputting a signal derived from an oscillating signal output from the oscillator as the synchronizing signal.

8. The power supply device according to claim 6, wherein the master DC-DC converter includes means for externally receiving an external oscillating signal and outputting a signal synchronized with the external oscillating signal as the synchronizing signal.

9. A power supply device comprising:
    a plurality of DC-DC converters according to any one of claims 1 to 5; and
    means for externally inputting a common synchronizing signal into each of the DC-DC converters.

10. The power supply device according to claim 9, wherein the means for externally inputting a common synchronizing signal comprises a master DC-DC converter which contains an oscillator, and includes means for outputting a signal derived from an oscillating signal output from the oscillator as the synchronizing signal.

11. The DC-DC converter according to claim 1, wherein the triangular wave generation circuit determines charging and discharging current values for the capacitor from an impedance of a resistance circuit.

12. The DC-DC converter according to claim 11, further comprising a switch for changing the impedance of the resistance circuit using a frequency switching signal.

* * * * *